US 8,988,857 B2

(12) United States Patent
McConnell et al.

(10) Patent No.: US 8,988,857 B2
(45) Date of Patent: Mar. 24, 2015

(54) HIGH ASPECT RATIO STACKED MLCC DESIGN

(75) Inventors: John E. McConnell, Pelzer, SC (US);
Alan P. Webster, Mauldin, SC (US);
Lonnie G. Jones, Greenville, SC (US);
Garry L. Renner, Easley, SC (US);
Jeffrey Bell, Fountain Inn, SC (US)

(73) Assignee: Kemet Electronics Corporation, Simpsonville, SC (US)

( * ) Notice: Subject to any disclaimer, the term of this patent is extended or adjusted under 35 U.S.C. 154(b) by 490 days.

(21) Appl. No.: 13/323,916

(22) Filed: Dec. 13, 2011

(65) Prior Publication Data

US 2013/0146347 A1 Jun. 13, 2013

(51) Int. Cl.
| | |
|---|---|
| *H01G 2/20* | (2006.01) |
| *H01G 4/06* | (2006.01) |
| *H01G 4/228* | (2006.01) |
| *H01G 4/30* | (2006.01) |
| *H05K 3/30* | (2006.01) |
| *H01G 4/38* | (2006.01) |
| *H01G 2/06* | (2006.01) |
| *H01G 4/232* | (2006.01) |

(52) U.S. Cl.
CPC ............. *H01G 4/30* (2013.01); *Y10T 29/49139* (2015.01); *Y10T 29/49142* (2015.01); *H05K 3/303* (2013.01); *H05K 2201/09063* (2013.01); *H05K 2201/10515* (2013.01); *H05K 2201/10772* (2013.01); *H05K 2201/10856* (2013.01); *H05K 2201/10878* (2013.01); *H01G 4/38* (2013.01); *H01G 2/06* (2013.01); *H01G 4/232* (2013.01)
USPC ................ 361/308.1; 361/321.2; 361/306.3

(58) Field of Classification Search
USPC ................. 361/306.3, 321.2, 308.1
See application file for complete search history.

(56) References Cited

U.S. PATENT DOCUMENTS

| | | | | |
|---|---|---|---|---|
| 4,541,034 A | * | 9/1985 | Fanning | 361/773 |
| 4,951,124 A | * | 8/1990 | Sawaya | 257/692 |
| 5,446,623 A | * | 8/1995 | Kanetake | 361/760 |
| 5,726,862 A | * | 3/1998 | Huynh et al. | 361/773 |
| 6,310,759 B2 | * | 10/2001 | Ishigaki et al. | 361/309 |
| 6,400,551 B1 | * | 6/2002 | Lin et al. | 361/301.3 |
| 6,828,667 B2 | * | 12/2004 | Yamasaki et al. | 257/693 |
| 6,839,218 B2 | * | 1/2005 | Satoh et al. | 361/306.1 |
| 6,885,538 B1 | * | 4/2005 | Ishii et al. | 361/301.3 |
| 6,940,708 B2 | * | 9/2005 | Yoshii et al. | 361/303 |
| 6,958,899 B2 | * | 10/2005 | Togashi et al. | 361/303 |
| 7,766,499 B2 | * | 8/2010 | Park et al. | 362/97.3 |

(Continued)

FOREIGN PATENT DOCUMENTS

| | | | |
|---|---|---|---|
| JP | 10241989 A | * | 9/1998 |
| JP | 2004172562 A | * | 6/2004 |

OTHER PUBLICATIONS

Korean Intellectual Property Office; International Search Report and The Written Opinion of the International Searching Authority; PCT/US2012/068706; Kemet Electronics Corporation.

*Primary Examiner* — David M Sinclair
(74) *Attorney, Agent, or Firm* — Joseph T. Guy; Perkins Law Firm, LLC

(57) ABSTRACT

An improved passive electronic stacked component is described. The component has a stack of individual electronic capacitors and a first lead attached to a first side of the stack. A second lead is attached to a second side of the stack. A foot is attached to the first lead and extends inward towards the second lead. A stability pin is attached to one of the foot or the first lead.

77 Claims, 10 Drawing Sheets

(56) References Cited

U.S. PATENT DOCUMENTS

| | | |
|---|---|---|
| 2001/0001258 A1 | 5/2001 | Ishigaki et al. |
| 2005/0041367 A1 | 2/2005 | Yoshii |
| 2009/0147440 A1* | 6/2009 | Cygan et al. ............... 361/306.3 |
| 2009/0244803 A1 | 10/2009 | Lee et al. |
| 2010/0053842 A1* | 3/2010 | Devoe et al. ............... 361/306.3 |
| 2010/0188798 A1 | 7/2010 | Togashi et al. |
| 2010/0243307 A1* | 9/2010 | McConnell et al. .......... 174/260 |

\* cited by examiner

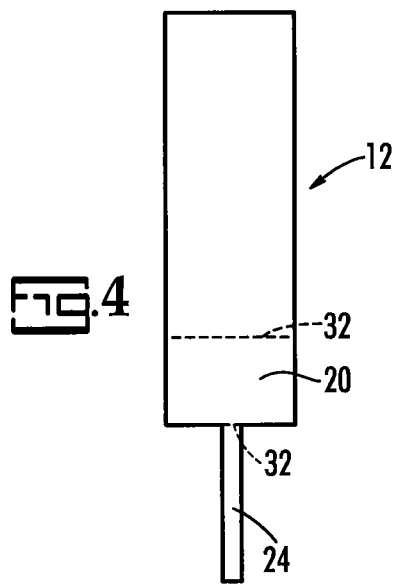
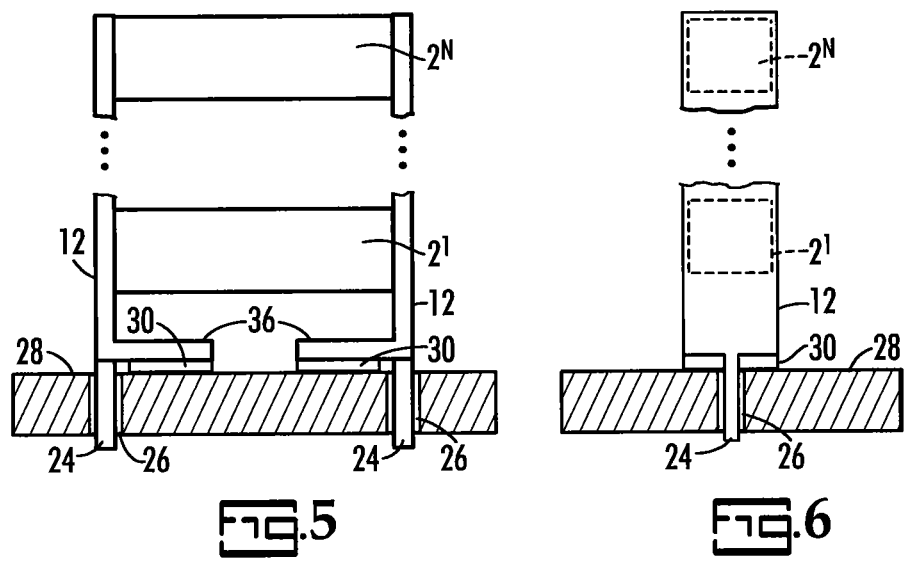

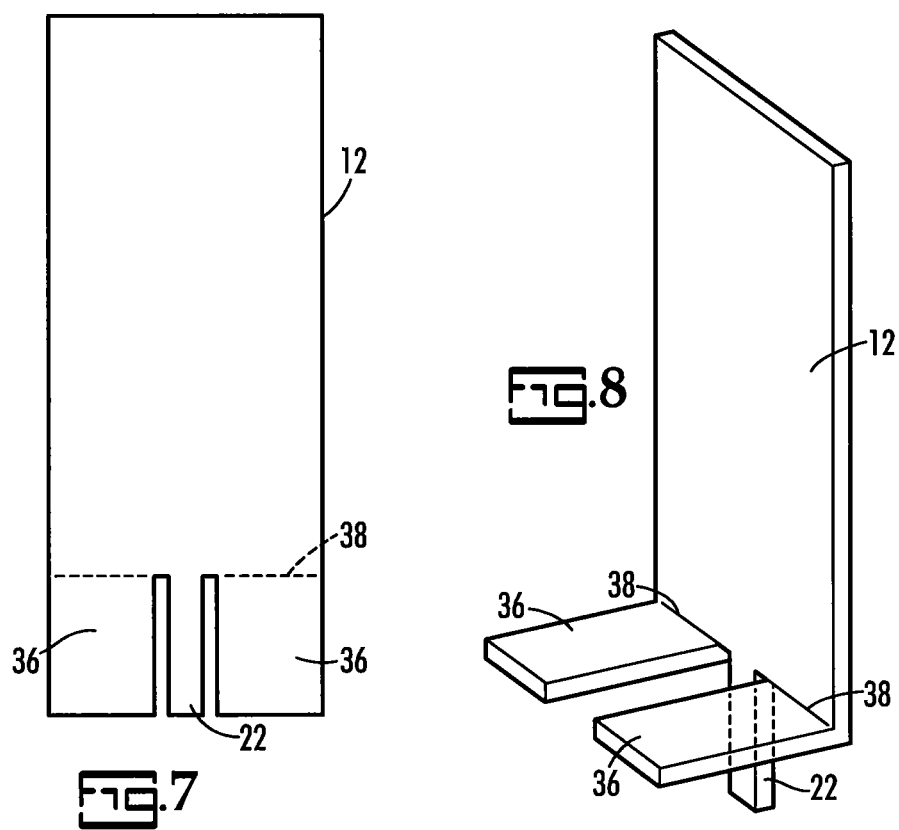

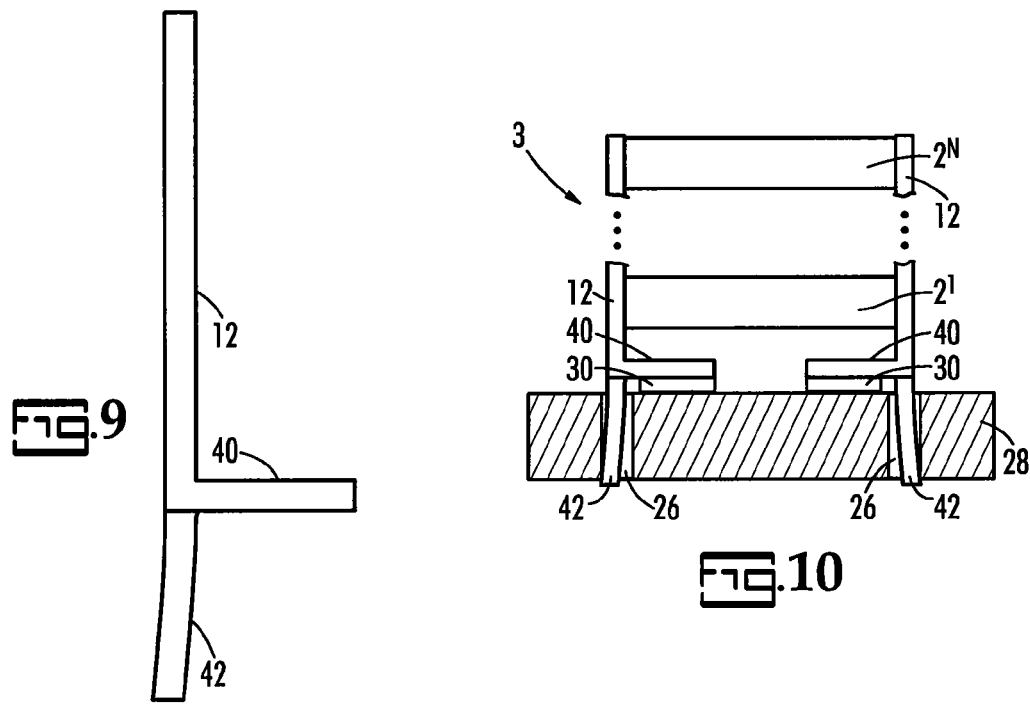
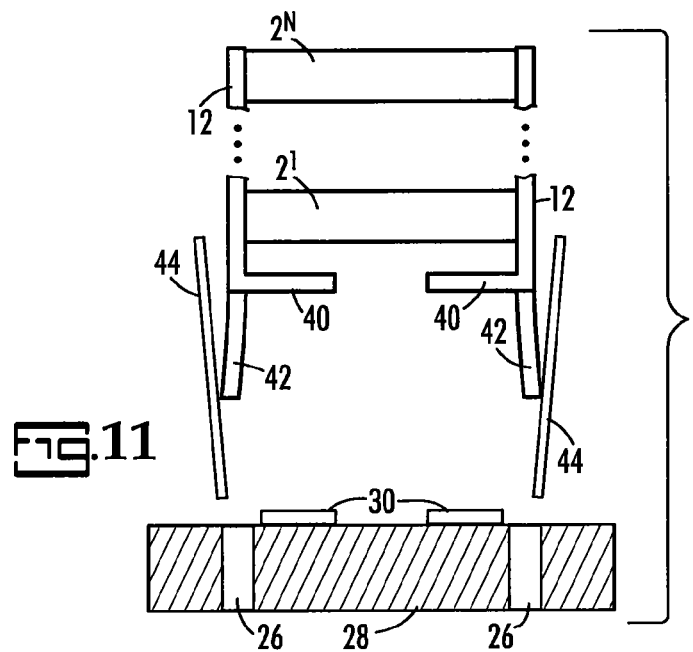

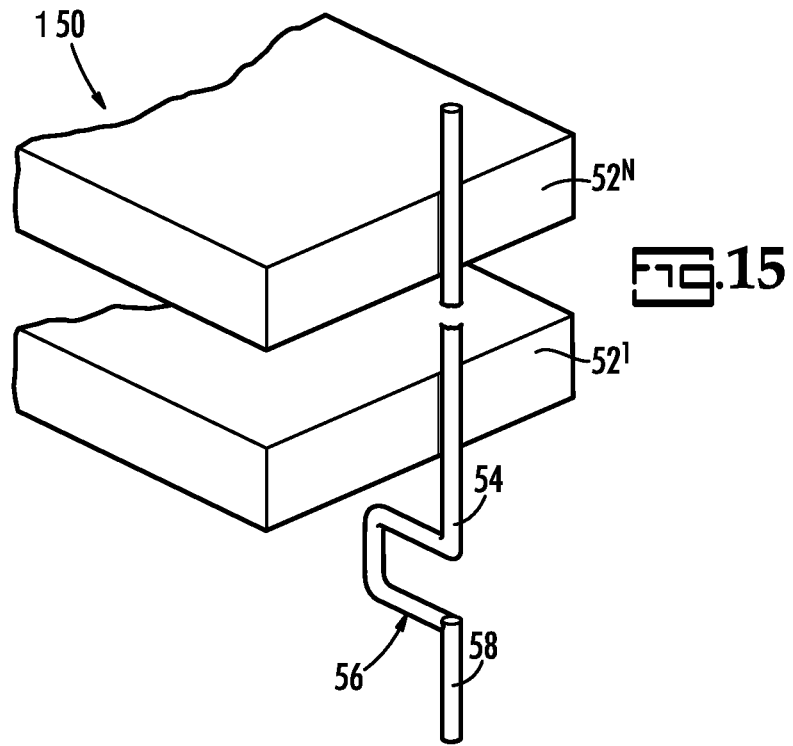
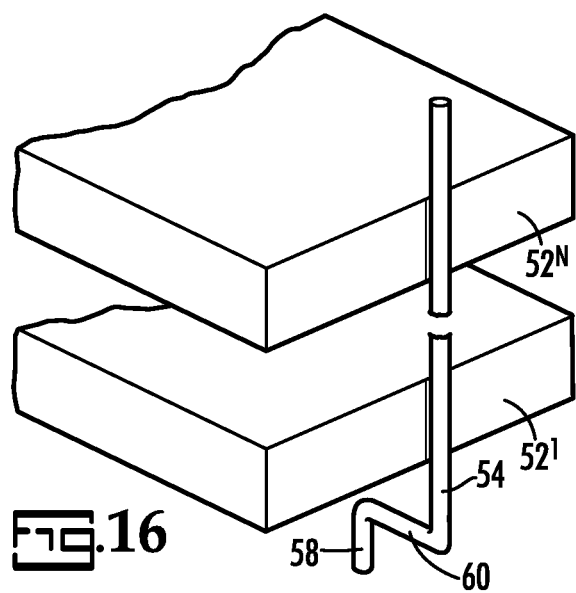

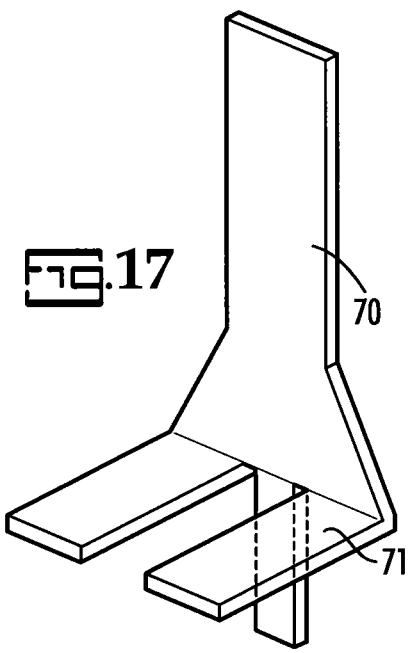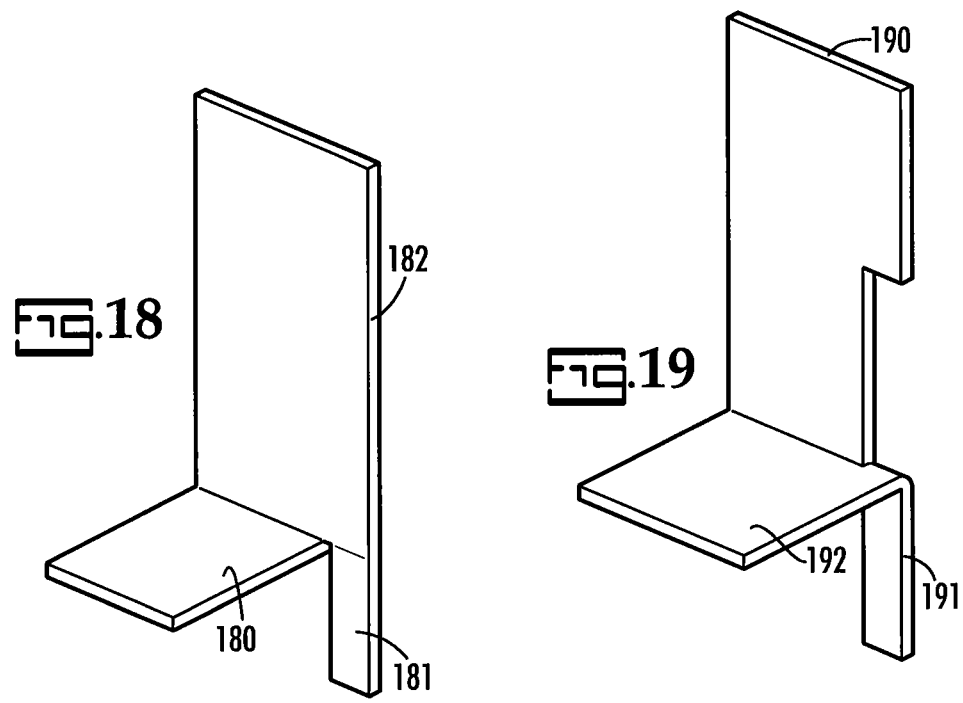

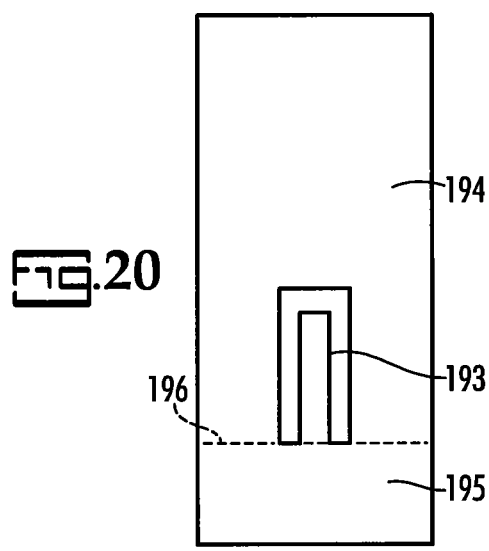
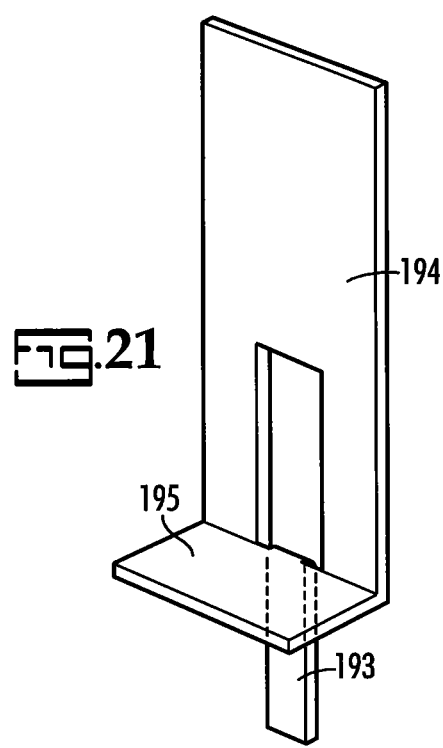

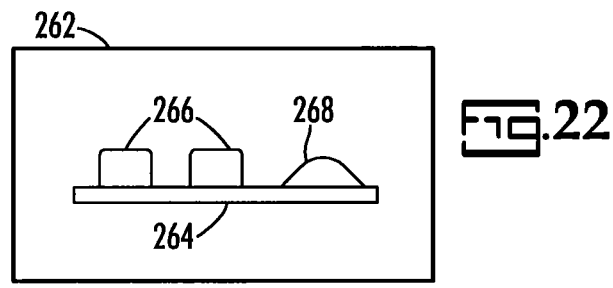
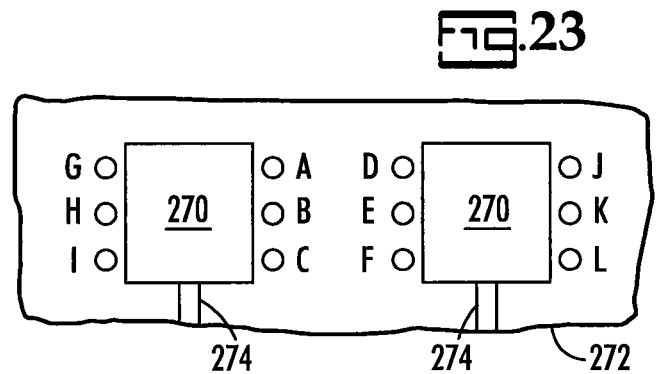
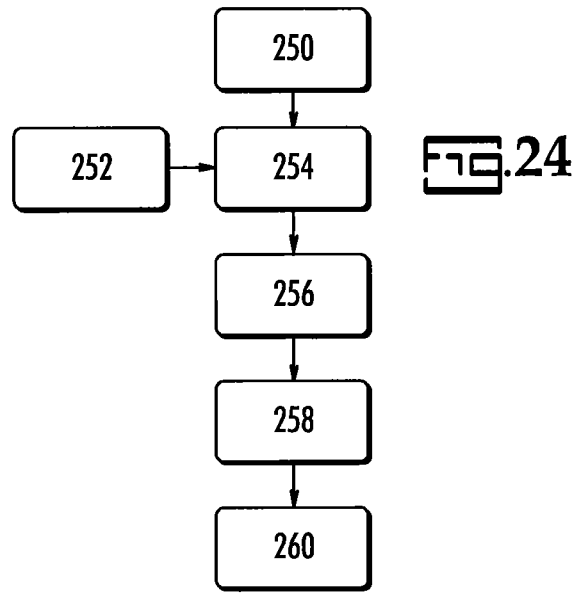

HIGH ASPECT RATIO STACKED MLCC DESIGN

BACKGROUND

The present invention is related to an improved capacitor suitable for use with a high packing density of electrical components and particularly capacitors. More specifically, the present invention is related to an improved external lead design which allows for a high height to width ratio in electronic components and specifically in stacked multi-layered ceramic capacitor (MLCC's).

In designing modern complex electrical circuits there are many considerations beyond the electrical specifications. Component stability during the assembly process is one very important criterion which must be considered in the design. As efforts continue towards further miniaturization this consideration becomes even more important. Increased lateral packing, parallel to the surface of the circuit board, has become increasingly more difficult due to the high demand for additional components. Therefore, taking advantage of vertical space, perpendicular to the surface of the circuit board, has been the subject of much focus. Further exploitation of the vertical direction requires components with a high aspect ratio, or height to shortest width ratio, which creates additional problems.

Components with a high aspect ratio cause problems during assembly since they are prone to shift, or topple over, during the assembly and solder reflow or attachment process. Typically, a component having a height to width aspect ratio of no more than about 1:1 is mechanically stable and not susceptible to toppling. However, as the aspect ratio increases the component becomes more unstable and is more susceptible to toppling.

One approach to solving the problem of toppling is the use of thru-hole technology where components have leads that extend through holes in the substrate or circuit board. The leads provide electrical contact between the component and the circuit board and provide mechanical stability to the component during the assembly and attachment process. Thru-hole technology has been, and is still being, used in the electronics industry typically in larger and more bulky type of electronic applications that utilize larger components with a low density interconnect applications such as less than approximately 50 interconnects per square inch.

For higher density applications, such as greater than about 50 interconnects per square inch, surface mount technology is preferred since this allows greater than 600 interconnects per square inch. The high density capability is achieved by miniaturizing the components and eliminating the leads from the components and by eliminating the respective thru-holes in the circuit board. The component leads are replaced by terminations on the component which are then soldered directly to the solder pads on the surface of the circuit board. Surface mount technology utilizes solder paste that is deposited onto each solder pad. The component is positioned and placed on the solder pads thereby making electrical contact with the circuit trace through the solder paste. Once all of the components are placed onto the circuit board the assembly is then passed through a solder reflow oven to reflow the solder paste thus making the same type of electrical and mechanical connection as does solder wave technology. Surface mount technology allows for a high density of components but the high density requires the use of components with a low aspect ratio to avoid toppling during solder reflow.

Component miniaturization exasperates the conflict between the size of components and their performance capability. Those of skill in the art are faced with the conundrum of using thru-hole technology, and forfeiting lateral packing density, or surface mount technology, which limits component geometry.

This problem is particularly relevant with MLCC's since the capacitance of the device is directly related to the size of the component. In the particular case of MLCC's, as their size decreases their capacitance decreases thereby creating a problem for the designers as they strive to meet electrical design requirements which demand more functionality and performance in a smaller package. One solution is to use a small footprint sized MLCC and stacking the MLCC's on top of one another. The capacitance value is then multiplied by the number of capacitors in the stack thus enabling the designer to meet both the foot print size requirement as well as the capacitance requirements. However, stacking small components on top of another increases the aspect ratio thereby creating a mechanically unstable part that is prone to toppling during assembly. Thru-hole, or mechanical supports, as now practiced in the art, increases the footprint which is contradictory to miniaturization as mentioned above.

There has been a long-standing, and now critically important, desire for a system and components which allow for use of vertical space on a circuit board without losses of lateral space while avoiding assembly issues such as component toppling. The present invention provides a solution to these contradictory desires.

SUMMARY

It is an object of the invention to provide improved electronic components and electronic devices using the improved electronic components.

It is a particular object of the invention to provide electronic components, and electronic devices using the electronic components, wherein vertical space can be effectively utilized.

A particular feature of the invention is the ability to assemble the electronic devices using the improved electronic components in standard manufacturing environments.

These and other advantages, as will be realized, are provided in a passive electronic stacked component. The component has a stack of individual electronic capacitors and a first lead attached to a first side of the stack. A second lead is attached to a second side of the stack. A foot is attached to the first lead and extends inward towards the second lead. A stability pin is attached to one of the foot or the first lead.

Yet another embodiment is provided in a method for forming an electronic device. The method includes:
providing a circuit board comprising at least one solder pad and at least one hole;
providing a stacked component comprising:
a stack of capacitors;
a first lead attached to a first side of the stack;
a second lead attached to a second side of the stack;
a foot attached to said first lead and extending inward towards second lead; and
a first stability pin attached to one of the first foot or the first lead;
placing the stack on the circuit board with the foot in contact with the solder pad and the first stability pin extending at least partially into the hole; and
heating the solder to form an electrical connection between the first foot and a circuit trace.

Yet another embodiment is provided in an electronic device. The electronic device has a circuit board with at least one solder pad and at least one hole. A passive electronic stacked component is electrically connected to the circuit board wherein the passive electronic stacked component comprises a stack of capacitors. A first lead is attached to a first side of the stack. A second lead is attached to a second side of the stack. A first foot is attached to the first lead and extending inward towards the second lead wherein the first foot is electrically attached to the solder pad. A stability pin is attached to one of the first foot or the first lead wherein the stability pin is in the hole.

BRIEF DESCRIPTION OF THE DRAWINGS

FIG. 4 is a schematic view of a lead prior to bending.
FIG. 5 is a schematic side view of an embodiment of the invention.
FIG. 6 is a schematic end view of the embodiment of FIG. 2
FIG. 7 is a schematic view of a lead prior to bending.
FIG. 8 is a perspective schematic view of the lead of FIG. 7 after bending.
FIG. 9 is a side schematic view of an embodiment of the invention.
FIG. 10 is a schematic side view of an embodiment of the invention.
FIG. 11 is a schematic side view of an embodiment of the invention.
FIG. 15 is a partial schematic side view of an embodiment of the invention.
FIG. 16 is a partial schematic side view of an embodiment of the invention.
FIG. 17 is a perspective schematic view of an embodiment of the invention.
FIG. 18 is a perspective schematic view of an embodiment of the invention.
FIG. 19 is a perspective schematic view of an embodiment of the invention.
FIG. 20 is a schematic view of a lead prior to bending.
FIG. 21 is a schematic side view of the embodiment of FIG. 20 after bending.
FIG. 22 is a flow chart representation of an embodiment of the invention.
FIG. 23 is a schematic representation of an embodiment of the invention.
FIG. 24 is a schematic representation of the possible configurations of stability pins.

DETAILED DESCRIPTION

Figure 25:
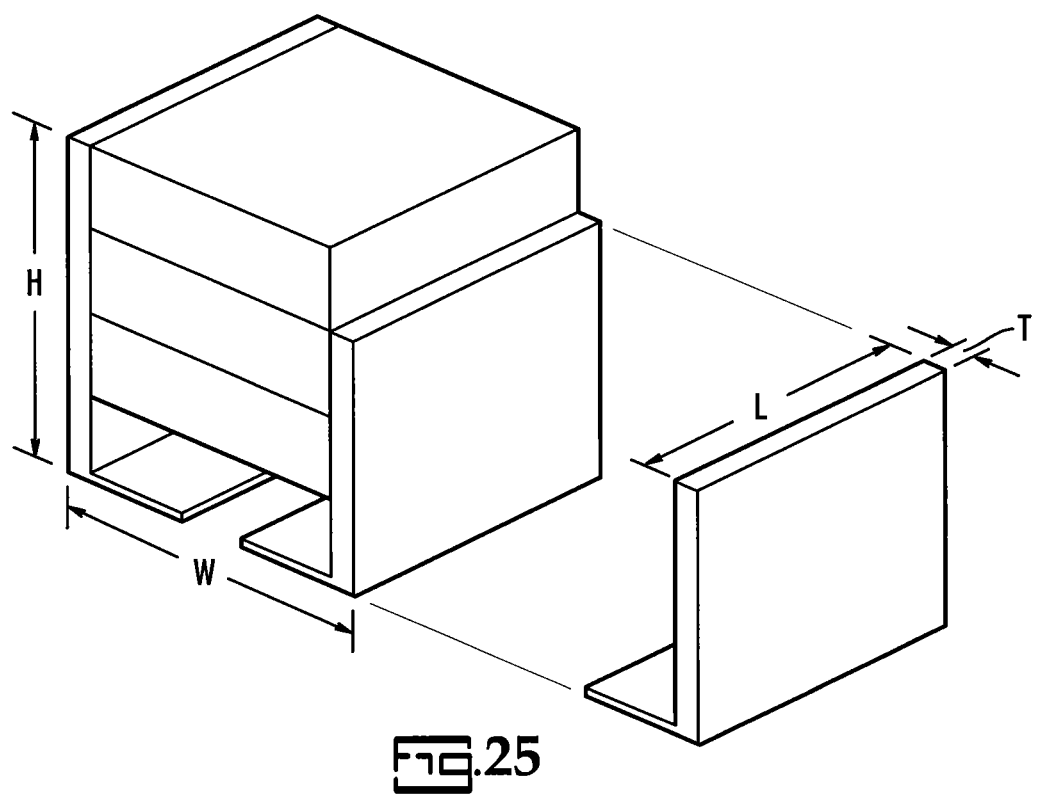
FIG. 25 is a schematic representation of an embodiment of the invention.

The present invention is directed to an improved lead structure for stacked electrical components and specifically for stacked MLCC's. More specifically, the present invention is related to a lead structure comprising locating pins which allow the aspect ratio, or height (H) over shortest width (W) as shown in FIG. 25, to be very large while minimizing the propensity for the stacked component to become dislodged or to topple over during processing.

The present invention provides a stack of capacitors, most preferably MLCC's, which allows a designer to utilize vertical space above the circuit board to increase the density of capacitors in a given area of circuit board thereby increasing the functionality such as capacitance density. This is accomplished by incorporating a stability pin into a lead frame, designed specifically for surface mount applications, wherein the stability pin extends into a void and preferably through the substrate or circuit board while a lead frame foot contacts the solder pad on the board for electrical conductivity. The addition of the stability pin allows designers to consider stacking multiple components, such as multiple MLCC's, one on top of another within common lead frames thereby achieving higher capacitance with smaller components creating aspect ratios of much greater than 3:1 while maintaining the foot print size of a single component.

The invention will be described with reference to the various figures which form an integral, non-limiting, part of the disclosure. Throughout the disclosure similar elements will be numbered accordingly.

Figure 1:
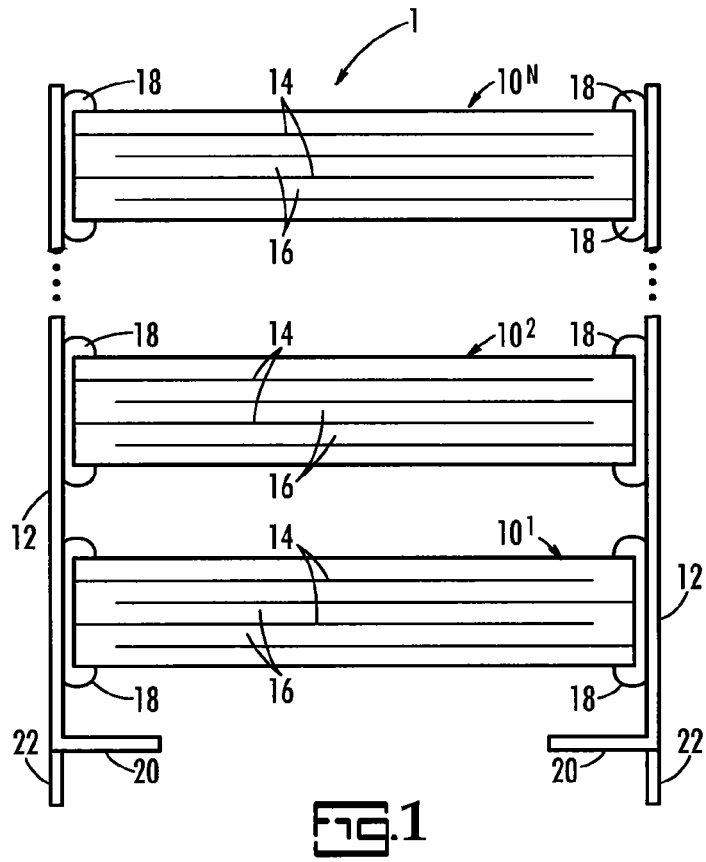
FIG. 1 is a cross-sectional schematic view of an embodiment of the invention.

An embodiment of the invention will be described with reference to FIG. 1. In FIG. 1, a stack of multi-layered ceramic capacitors is generally represented at 1 in cross-sectional schematic view. A series of individual capacitors, $10^1$-$10^n$, are secured between leads, 12, of opposing polarity. Each individual capacitor comprises parallel planer electrodes, 14, with dielectric, 16, there between. Alternating electrodes terminate at opposite external terminations, 18. The external terminations, 18, are secured to the leads by soldering or the like. The leads comprise a foot, 20, which may be bifurcated, and at least one stability pin, 22, extending downward. In mounting to a substrate the stability pin is inserted into a hole, or void, in the substrate or circuit board and each foot is electrically connected to a circuit trace through a solder pad.

Figure 2:
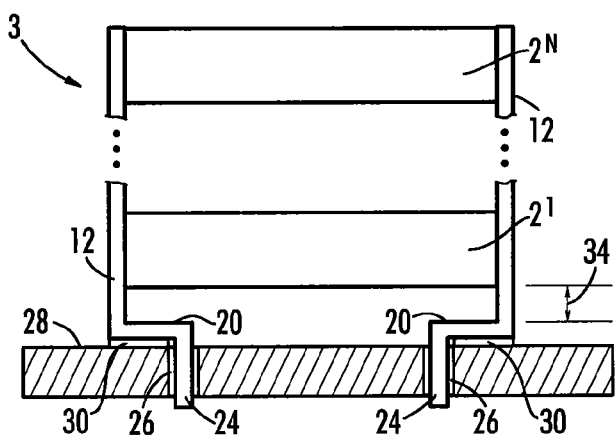
FIG. 2 is a schematic side view of an embodiment of the invention.
Figure 3:
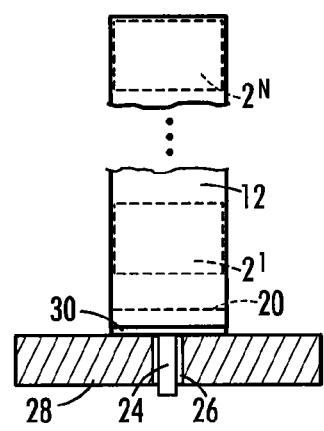
FIG. 3 is a schematic end view of the embodiment of FIG. 2

Another embodiment of the invention is illustrated in schematic side view in FIG. 2 and schematic end view in FIG. 3. In FIG. 2, a series of capacitors, 2, are stacked between leads, 12, to form a stacked component, 3. Each capacitor is preferably an MLCC. Each lead frame comprises a foot, 20, preferably extending perpendicular thereto and inward, with a stability pin, 24, extending through a hole, 26, of a circuit board, 28. Each foot is electrically connected to a trace of the circuit board by a solder pad, 30. The stability pin is preferably narrower than the foot and preferably sized to fit into the hole easily but which will not allow the stacked component to topple. The lead, 12, is illustrated in FIG. 4 prior to bending at the bend lines, 32. Bending is preferably done prior to component attachment. As would be realized the components are mounted in the leads to insure a stand-off distance, 34, between the components and the foot which allows for cleaning of any solder there between after assembly to the board.

Another embodiment is illustrated in schematic side view in FIG. 5 and in schematic end view in FIG. 6. In FIG. 5 the capacitors, 2, which are preferably MLCC's, are between leads, 12, of opposing polarity. At least one lead has a bifurcated foot, 36, and a stability pin, 24, extending therefrom. The bifurcated foot is preferably approximately perpendicular to the lead thereby allowing for attachment to a solder pad, 30, on the circuit board, 28. The stability pin is approximately parallel to the lead to allow insertion into a hole, 26, of the circuit board. A lead suitable for use in the embodiment of FIGS. 5 and 6 is schematically illustrated prior to bending in FIG. 7 and after bending along bend line, 38, in FIG. 8.

A flared stability pin is illustrated schematically in side view in FIG. 9. In FIG. 9 the lead, 12, has a foot, 40, attached thereto wherein the foot may be a bifurcated foot. A flared pin, 42, is attached to the lead which extends from the lead at an angle of the plane containing the lead the purpose of which is discussed with reference to FIG. 10. In FIG. 10 a stacked component, 3, comprising a series of capacitors, 2, stacked between leads which is illustrated in schematic side view. The foot, 40, is in electrical contact with the solder pad, 30. The flared pins, 42, extend into the hole, 26, with the flared portion being pressed by the wall towards parallel with the lead causes impingement between the flared pin and the wall of the hole thereby increasing the force required to topple the stacked component. A method of inserting the flared pins is illustrated in FIG. 11 wherein an insertion tool, 44, with converging legs persuades the flared pins toward a parallel position to allow the pins to enter the holes. Once the pins are in the hole their natural tendency to relax towards the flared position places them into friction contact with the wall of the hole. While illustrated with two flared pins a single flared pin can be used. In one embodiment the other side can comprise a stability pin which is parallel to the lead. The flared pin of FIGS. 9-11 is illustrated as an outbound flare wherein the flair is outward which is preferred. In some instances an inbound flare may be preferred. Other forms creating a friction fit between the stability pin and the hole may be utilized for demonstration of the invention.

Figure 12:
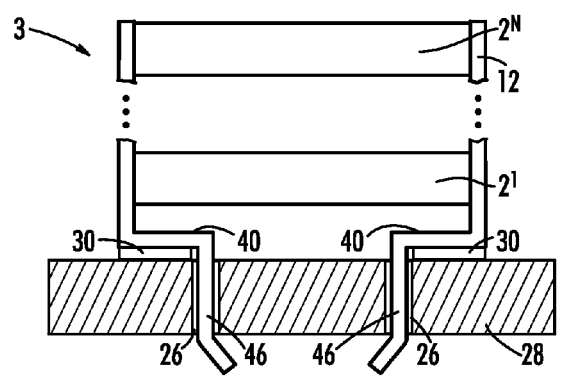
FIG. 12 is a schematic side view of an embodiment of the invention.
Figure 13:
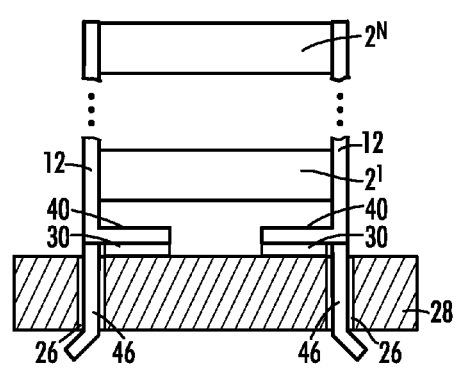
FIG. 13 is a schematic side view of an embodiment of the invention.

Embodiments of the invention are illustrated in schematic side view in FIGS. 12 and 13. In each figure a stacked component, 3, comprising a stack of capacitors, $2^1$-$2^n$, between leads, 12, of opposing polarity is illustrated. Extended pins, 46, are illustrated wherein extended pins are defined herein as pins that extend through the hole, 26, and protrude at least partially through the circuit board or substrate, 28. In FIG. 12 the extended pins are crimped inboard, or towards each other whereas in FIG. 13 the extended pins are crimped outboard. Each stacked component may comprise a single extended pin or multiple extended pins. The length for the clinched pin design is preferably the board thickness plus about 0.254+/−0.0127 cm (0.100+/−0.005 inches), this length can be varied to accommodate equipment clinching capabilities.

Figure 14:
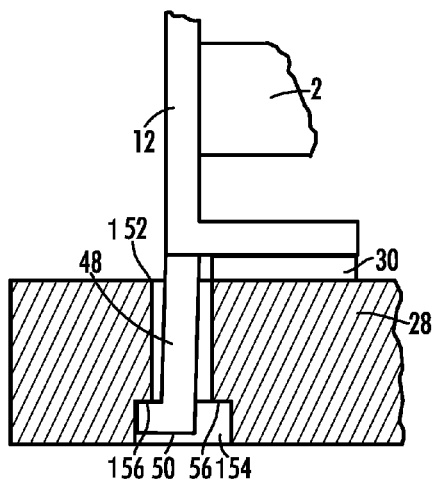
FIG. 14 is a partial schematic side view of an embodiment of the invention.

An embodiment of the invention is illustrated in partial schematic view in FIG. 14. In FIG. 14 the stability pin, 48, comprises a catch, 50, extending from the termination of the stability pin at an angle. The circuit board or substrate, 28, comprises a primary bore, 152, and a larger secondary bore, 154, intersecting the primary bore and opposite the side on which the component is to be mounted. A land, 156, is formed at the junction of the primary and secondary bore. The stability pin is preferably flared towards the catch and the catch, 50, is sufficiently small to traverse the primary bore and when entering the secondary bore the catch engages the land thereby securing the device in position. In one embodiment the primary bore can be formed by drilling a first hole through the substrate with the secondary bore formed thereafter with a larger drill passing only partially through the circuit board and at least overlapping the primary bore. Alternatively, the catch can pass through the substrate and engage the face of the substrate opposite the component wherein the face functions as a land.

An embodiment of the invention is illustrated in schematic partial perspective view in FIG. 15. In FIG. 15, a stacked component, 150, comprises a stack of capacitors, $52^1$-$52^n$, wherein each capacitor is preferably an MLCC. The lead, 54, has a small cross-sectional projection ratio defined as the ratio of the longest cross-sectional length (L) to the shortest cross-sectional length or thickness (T) as illustrated in FIG. 25. The longest dimension of the cross-sectional is less than three times the shortest dimension of the cross-section. A cross-sectional projection ratio of approximately unit, which is a circle, is most preferred although the cross-section may be distorted by pressure during assembly. Particularly preferred leads are conductive wires. Conductive wire leads are particularly advantageous for small capacitors such as those with a length of 0.20 cm (0.080 inches) and a width of 0.10 cm (0.040 inches), a length of 0.15 cm (0.060 inches) and a width of 0.075 cm (0.030 inches), a length of 0.10 cm (0.040 inches) and a width of 0.05 cm (0.020 inches) or a length of 0.05 cm (0.020 inches) and a width of 0.025 cm (0.010 inches). The lead has a stand-off, 56, which is a departure from linearity. The stand-off functions as a foot during mounting. The stand-off is attached to, and is preferably integral to, the lead and preferably formed from a continuous wire bent to form the stand-off and stability pin. A stability pin, 58, extends downward from the stand-off and is preferably approximately co-linear with the lead. When the stability pin is inserted into a hole in a circuit board the stand-off rest on the solder pad and is electrically connected thereto.

An embodiment of the invention is illustrated in FIG. 16 wherein the stability pin, 58, is attached to the stand-off, 60, parallel to but non-linear to the lead. The stand-off is integral to the lead and preferably formed from a continuous wire bent to form the stand-off and stability pin.

An embodiment of the invention is illustrated in FIG. 17 wherein a diverging lead is illustrated in perspective view. At least a portion of the lead, 70, diverges at the bottom towards the foot, 71, which is illustrated as a bifurcated foot, thereby allowing for a foot which is slightly wider than the lead. A significant advantage of the diverging lead is that it provides the maximum amount of material width to accommodate assembly tolerances as well as clearances required in the stamping process to produce the stability pin. The diverging lead is preferably the width of the widest MLCC capacitor but does not consume any more circuit board space than the component itself. This design feature provides for the maximum width stability pin for a given width of capacitor.

Embodiments of the invention are illustrated in FIGS. 18 and 19. In FIG. 18 a portion of the foot, 180, is sacrificed to form a stability pin, 181, wherein the stability pin extends from the lead, 182. In FIG. 18, the lead is wider than the foot at the junction of the foot and lead. In FIG. 19 a portion of the lead, 190, is sacrificed to form the stability pin, 191, wherein the stability pin is attached to the foot, 192. In FIG. 19, the lead is narrower than the foot at the junction of the foot and lead. In FIGS. 18 and 19 the stability pin is parallel to, and co-planer with, the lead.

An embodiment of the invention is illustrated in FIG. 20 prior to bending and in FIG. 21 after bending. A portion of the lead, 194, is sacrificed to form the stability pin, 193. Upon bending at a bend line, 196, the stability pin extends downward from the foot, 195.

An embodiment of the invention is illustrated in FIG. 24 as a flow chart. In FIG. 24, a series of stacked capacitors between leads is provided, such as in a carrier tape, at 250 wherein each lead has a stability pin associated therewith. A circuit board is provided at 252. The series of stacked capacitors and circuit board are inserted into a pick and place system at 254. Each stacked capacitor is picked and placed on the circuit board with each foot in contact with a solder pad on the circuit board and the stability pin in a hole in the circuit board at 256. After all components, stacked or otherwise, are placed on the circuit board the solder is heated to form an electrical bond between each foot of the stacked component and a circuit trace on the circuit board at 258. The circuit board with the stacked components bonded thereto is inserted into an electronic device at 260.

An embodiment of the invention is illustrated schematically in FIG. 22. In FIG. 22 an electronic device is represented at 262. The electronic device has a circuit board, 264, therein with stacked MLCC's, 266, having stability pins attached to the circuit board. Additional electronic components, active and/or passive, are represented by 268.

An embodiment of the invention is illustrated in FIG. 23 wherein illustrated is a pair of solder pads, 270, on a circuit board, 272. Each solder pad is in electrical contact with a circuit trace, 274. Holes, A-L, represents the preferred locations for holes which will receive a stability pin. At least one hole is provided in either an inboard location (A-F) which is between solder pads or an outboard location (G-L) with inboard being preferred. At least one hole is provided. Any number or combination of holes can be used depending on the size of the stacked component with one hole in proximity to each solder pad being preferred. To increase stability it is preferable to have diagonally arranged holes, such as A and F or G and L, since this provides adequate protection against toppling. When outboard holes are used it is preferable for them to be as close to the solder pad as practical. While illustrated as three holes along parallel sides the sides perpendicular to those illustrated may be used but these are less preferable. Anywhere along the side can be the site of a hole with preferred locations being as close to the corner as possible or centrally placed.

A large number of capacitors can be stacked between leads. It is preferably to have at least two capacitors with up to 20 being suitable for demonstration of the invention. In most practical applications about 3 to about 10 capacitors are stacked with each preferably being an MLCC.

The advantage of the proposed invention is that it does not detract from the useable space on the circuit board thus maintaining the advantages of high density interconnects provided by surface mount devices while offering mechanical stability found in leaded components without sacrificing valuable board space. While this invention still requires a hole in the circuit board for the stability pin, the hole can be sized and positioned to fit within the soldering pad for the component, thus not requiring additional circuit board space.

The lower the clearance between the stability pin and the walls of the hole the lower the amount the device is allowed to slant or become displaced from vertical. In one embodiment the holes in the circuit board are sized to provide the least amount of gap between the diameter of the hole and the width of the pin.

In another embodiment the width of the pin is sized to minimize the gap between the pin and the walls of the hole.

In another embodiment the length of the stability pin is sufficiently long to extend through the circuit board so it can then be clinched on the back side of the board. Crimping provides a very secure and stable option.

Another embodiment is to provide impingement between the pin and side wall of the hole.

Another embodiment is to provide a catch on the stability pin.

For small components having a relatively low mass one stability pin per lead frame is sufficient. A particular advantage of the instant invention is the incorporation of stability pins into the foot of the lead frame or the side of the lead frame itself which reduces stresses induced into the solder joint connecting the lead frame to the MLCC. Any stresses incurred will be absorbed by the lead frame foot or the lead frame itself, depending on how the stability pin is designed into the lead frame. In one embodiment the length of the pin is the board thickness to no more than 0.00127 cm (0.005 inches) shorter than the board thickness. In one embodiment the end of the pin does not extend beyond the bottom surface of the board. The stability pins can also be flared outwardly. However, for larger parts with increased mass the number of stability pins can be increased and limited only by the size of the lead frame width itself. It is also noted that other features can be utilized to increase the stability of a part by using a lead frame and will be obvious to those skilled in the art.

For small size components such as those with a longest dimension of no more than 0.02 cm (0.08 inches) round wire leads with a cross-sectional projection ratio of less than 3:1 may be used instead of using typical flat stock thus eliminating the need for a stamping process. The parts are small enough that a round wire of 0.28 cm (0.015 inches) to 0.05 cm (0.020 inches) in diameter is sufficient to demonstrate the mechanical and electrical interconnect between the stacked MLCC's and making the lead long enough to extend into the circuit board to provide added stability when multiple MLCC's are stacked one on top of another. It is also possible to incorporate a formed stand-off into the round wire lead if to provide clearance between the bottom MLCC and the circuit board. The clearance allows for cleaning under the board after solder reflow.

The lead frame made from flat stock is much thinner and would decrease the overall length of the part. Flat stock has an cross-sectional projection ratio of at least 3:1 and preferably up to 100:1. An example would be the use of a 0.46 cm (0.018 inch) diameter wire verses a 0.013 cm (0.005 inch) flat lead frame making a 33 cm (0.013 inch) difference in thickness between the two materials which then equates into reducing the overall length of a component 0.066 cm (0.026 inch). The size of the component, a 0402 is 0.10 cm (0.040 inches) long or approximately 50% of the length of the actual part. For many applications, flat leads are mounted on the short side of the rectangular stack with their face perpendicular to the long side of the components. In other applications, flat leads are mounted on the long side of rectangular components with their face perpendicular to the long side of components.

The lead can be any lead frame material typically used for such applications such as Alloy 42, Kovar, Phosphor bronze, Copper, Beryllium Copper, and various alloys thereof.

The dielectric is not particularly limited herein. The conductive plates are separated by a dielectric as well known in the art and exemplified in U.S. Pat. Nos. 7,211,740; 7,172,985; 7,164,573; 7,054,137; 7,068,490 and 6,906,907 each of which is incorporated herein by reference. Conductive plates separated by dielectric forms a capacitor as known in the art. While not limited thereto, a dielectric layer with a thickness of about 0.2 µm up to about 50 µm is suitable for demonstration of the teachings herein. The number of dielectric layers stacked is generally from 2 to about 500 without limit thereto.

The conductive material which forms the internal electrodes is not critical, although a base metal electrode (BME) is preferably used due to cost considerations particularly when the dielectric material of the dielectric layers has anti-reducing properties. Typical base metals are nickel, copper, titanium, tungsten, molybdenum, alloys or cermets of base metals or base metal alloys with nickel being preferred. Preferred nickel alloys are alloys of nickel with at least one member selected from Cu, Si, Ba, Ti, Mn, Cr, Co, and Al, with such nickel alloys containing at least 95 wt % of nickel being more preferred. Precious metal electrodes (PME) can be used with the proviso that a sintered silver undercoat is used. Preferred precious metals include silver, palladium, gold, platinum and alloys thereof such as silver-palladium and silver-palladium-platinum. The thickness of the internal electrodes is not particularly limited although about 0.2 μm to about 5 μm is suitable for demonstration of the teachings herein.

The multilayer ceramic chip capacitor of the present invention generally is fabricated by forming a green chip by conventional printing and sheeting methods using pastes, firing the chip, and printing or transferring external electrodes thereto followed by baking.

Paste for forming the dielectric layers can be obtained by mixing a raw dielectric material with an organic or aqueous vehicle. The raw dielectric material may be a mixture of oxides and composite oxides as previously mentioned. Also useful are various compounds which convert to such oxides and composite oxides upon firing. These include, for example; carbonates, oxalates, nitrates, hydroxides, and organometallic compounds. The dielectric material is obtained by selecting appropriate species from these oxides and compounds and mixing them. The proportion of such compounds in the raw dielectric material is determined such that after firing, the specific dielectric layer composition may be met. Raw dielectric material in a powder form having a mean particle size of about 0.1 to about 3 μm is suitable for demonstration of the teachings herein. Dielectrics are well known and not limited herein.

A green chip may be prepared from the dielectric layer-forming paste and the internal electrode layer-forming paste. In the case of deposition by printing methods, a green chip is prepared by alternately printing the pastes onto a substrate of polyethylene terephthalate (PET), for example, in laminar form, cutting the laminar stack to a predetermined shape and separating it from the substrate.

Also useful is a sheeting method wherein a green chip is prepared by forming green sheets from the dielectric layer-forming paste, printing the internal electrode layer-forming paste on the respective green sheets, and stacking the printed green sheets.

The binder is then removed from the green chip and fired. Binder removal may be carried out under conventional conditions where the internal electrode layers are formed of a base metal conductor such as nickel and nickel alloys.

The term "direct" with reference to electrical contact is taken to define an electrical connection between two layers with no layer there between. When two layers of different composition are combined a blended layer wherein one component diffuses into the other thereby forming an intermediate composition is considered a direct electrical connection.

Paste for forming internal electrode layers is obtained by mixing an electro-conductive material with an organic or aqueous vehicle. The conductive material used herein includes conductors such as conductive metals and alloys as mentioned above and various compounds which convert into such conductors upon firing, for example, oxides, organometallic compounds and resinates.

The invention has been described with reference to the preferred embodiments without limit thereto. One of skill in the art would realize additional embodiments and alterations which are within the scope of the invention as set forth in the claims appended hereto

The invention claimed is:
1. A passive electronic stacked component comprising:
a stack of individual electronic capacitors;
a first lead secured to a first side of said stack;
a second lead secured to a second side of said stack;
a foot attached to said first lead and extending inward towards the second lead with a stand-off distance between said foot and said stack; and
a stability pin attached to one of said foot or said first lead wherein said first lead has a cross-sectional projection ratio of at least 3:1 and wherein at least a portion of said first lead diverges towards said foot.

2. The passive electronic stacked component of claim 1 wherein at least one capacitor of said capacitors is a multi-layered ceramic capacitor.

3. The passive electronic stacked component of claim 2 comprising at least 2 multi-layered ceramic capacitors.

4. The passive electronic stacked component of claim 3 comprising no more than 20 multi-layered ceramic capacitors.

5. The passive electronic stacked component of claim 4 wherein each multi-layered ceramic capacitor has a width of no more than 0.500 inches.

6. The passive electronic stacked component of claim 1 having an aspect ratio of at least 3:1.

7. The passive electronic stacked component of claim 1 wherein said first lead has a cross-sectional projection ratio of no more than 100:1.

8. The passive electronic stacked component of claim 1 wherein a long dimension of said first lead is perpendicular to a long side of a rectangular stacked component.

9. The passive electronic stacked component of claim 1 wherein a long dimension of said first lead is parallel to a long side of a rectangular stacked component.

10. The passive electronic stacked component of claim 1 wherein said stability pin is parallel with said first lead.

11. The passive electronic stacked component of claim 1 wherein said stability pin is co-planer with said first lead.

12. The passive electronic stacked component of claim 1 wherein said first lead comprises an integrally formed stand-off.

13. The passive electronic stacked component of claim 12 wherein said stability pin is attached to said stand-off.

14. The passive electronic stacked component of claim 13 wherein said stability pin is collinear with said first lead.

15. The passive electronic stacked component of claim 13 wherein said stability pin is parallel with said first lead.

16. The passive electronic stacked component of claim 1 wherein said second lead comprises a second stability pin.

17. The passive electronic stacked component of claim 1 wherein said stability pin extends from said foot.

18. The passive electronic stacked component of claim 1 wherein said stability pin extends from said first lead.

19. The passive electronic stacked component of claim 1 wherein said foot is a bifurcated foot.

20. The passive electronic stacked component of claim 1 wherein said foot is narrower than said lead at a junction of said foot and said lead.

21. A passive electronic stacked component comprising:
a stack of individual electronic capacitors;
a first lead secured to a first side of said stack;
a second lead secured to a second side of said stack;
a foot attached to said first lead and extending inward towards the second lead with a stand-off distance between said foot and said stack; and
a stability pin attached to one of said foot or said first lead wherein said second lead comprises a second stability pin wherein said second stability pin is diagonally across said stacked component from said stability pin.

22. A passive electronic stacked component comprising:
a stack of individual electronic capacitors;
a first lead secured to a first side of said stack;

a second lead secured to a second side of said stack;
a foot attached to said first lead and extending inward towards the second lead with a stand-off distance between said foot and said stack; and
a stability pin attached to one of said foot or said first lead wherein said stability pin is a flared pin extending at an angle relative to said first lead.

23. The passive electronic stacked component of claim 22 wherein said flared pin is an outward flared pin.

24. A passive electronic stacked component comprising:
a stack of individual electronic capacitors;
a first lead secured to a first side of said stack;
a second lead secured to a second side of said stack;
a foot attached to said first lead and extending inward towards the second lead with a stand-off distance between said foot and said stack; and
a stability pin attached to one of said foot or said first lead wherein said foot is wider than said lead at a junction of said foot and said lead.

25. A method for forming an electronic device comprising:
providing a circuit board comprising at least one solder pad and at least one hole;
providing a stacked component comprising:
a stack of capacitors;
a first lead secured to a first side of said stack;
a second lead secured to a second side of said stack;
a foot attached to said first lead with a stand-off distance between said foot and said stack and extending inward towards second lead; and
a first stability pin attached to one of said first foot or said first lead; placing said stack on said circuit board with said foot in contact with said solder pad and said first stability pin extending at least partially into said hole;
heating said solder to form an electrical connection between first foot and a circuit trace; and
wherein said stability pin is a flared pin extending at an angle relative to said first lead.

26. The method for forming an electronic device of claim 25 wherein said flared pin is an outward flared pin.

27. The method for forming an electronic device of claim 25 wherein said stability pin has a length which is longer than a thickness of said circuit board.

28. The method for forming an electronic device of claim 27 further comprising crimping said stability pin.

29. The method for forming an electronic device of claim 25 wherein at least one capacitor of said capacitors is a multi-layered ceramic capacitor.

30. The method for forming an electronic device of claim 29 comprising at least 2 multi-layered ceramic capacitors.

31. The method for forming an electronic device of claim 30 comprising no more than 20 multi-layered ceramic capacitors.

32. The method for forming an electronic device of claim 25 having an aspect ratio of at least 3:1.

33. The method for forming an electronic device of claim 25 wherein said first lead attachment has a cross-sectional projection ratio of at least 3:1.

34. The method for forming an electronic device of claim 33 wherein said first lead attachment has a cross-sectional projection ratio of no more than 100:1.

35. The method for forming an electronic device of claim 33 wherein at least a portion of said first lead attachment diverges towards said foot.

36. The method for forming an electronic device of claim 33 wherein a long dimension of said first lead is perpendicular to a long side of a rectangular stacked component.

37. The method for forming an electronic device of claim 33 wherein a long dimension of said first lead is parallel to a long side of a rectangular stacked component.

38. The method for forming an electronic device of claim 25 wherein said first lead attachment has a cross-sectional projection ratio of less than 3:1

39. The method for forming an electronic device of claim 38 wherein said first lead attachment has a cross-sectional projection ratio of at least 1:1.

40. The method for forming an electronic device of claim 38 wherein said first lead attachment comprises an integrally formed stand-off.

41. The method for forming an electronic device of claim 40 wherein said stability pin is attached to said stand-off.

42. The method for forming an electronic device of claim 41 wherein said stability pin is collinear with said first lead.

43. The method for forming an electronic device of claim 41 wherein said stability pin is parallel with said first lead.

44. The method for forming an electronic device of claim 25 wherein said second lead comprises a second stability pin.

45. The method for forming an electronic device of claim 44 wherein said second stability pin is diagonally across said stacked component from said stability pin.

46. The method for forming an electronic device of claim 25 wherein said stability pin extends from said foot.

47. The method for forming an electronic device of claim 25 wherein said stability pin extends from said first lead.

48. The method for forming an electronic device of claim 25 wherein said foot is a bifurcated foot.

49. The method for forming an electronic device of claim 25 wherein said foot is wider than said lead at a junction of said foot and said lead.

50. The method for forming an electronic device of claim 25 wherein said foot is narrower than said lead at a junction of said foot and said lead.

51. A method for forming an electronic device comprising:
providing a circuit board comprising at least one solder pad and at least one hole;
providing a stacked component comprising:
a stack of capacitors;
a first lead secured to a first side of said stack;
a second lead secured to a second side of said stack;
a foot attached to said first lead with a stand-off distance between said foot and said stack and extending inward towards second lead; and
a first stability pin attached to one of said first foot or said first lead; placing said stack on said circuit board with said foot in contact with said solder pad and said first stability pin extending at least partially into said hole; and
heating said solder to form an electrical connection between first foot and a circuit trace wherein said stability pin further comprises a catch.

52. The method for forming an electronic device of claim 51 wherein said catch engages with said circuit board.

53. An electronic device comprising:
a circuit board comprising at least one solder pad and at least one hole;
a passive electronic stacked component electrically connected to said circuit board wherein said passive electronic stacked component comprises:
a stack of capacitors;
a first lead secured to a first side of said stack;
a second lead secured to a second side of said stack;
a first foot attached to said first lead with a stand-off distance between said foot and said stack and extending inward towards second lead wherein said first foot is electrically attached to said solder pad; and a stability pin attached to one of said first foot or said first lead wherein said stability pin is in said hole wherein said stability pin extends through said circuit board and wherein said stability pin is clinched.

54. The electronic device of claim 53 wherein said stability pin does not extend through said circuit board.

55. The electronic device of claim 53 wherein said stability pin is parallel to said first lead.

56. The electronic device of claim 53 wherein at least one capacitor of said capacitors is a multi-layered ceramic capacitor.

57. The electronic device of claim 56 comprising multiple multi-layered ceramic capacitors.

58. The electronic device of claim 57 comprising at least 2 multi-layered ceramic capacitors.

59. The electronic device of claim 58 comprising no more than 20 multi-layered ceramic capacitors.

60. The electronic device of claim 53 having an aspect ratio of at least 3:1.

61. The electronic device of claim 53 wherein said first lead attachment has a cross-sectional projection ratio of at least 3:1.

62. The electronic device of claim 61 wherein said first lead attachment has a cross-sectional projection ratio of no more than 100:1.

63. The electronic device of claim 61 wherein at least a portion of said first lead attachment diverges towards said foot.

64. The electronic device of claim 61 wherein a long dimension of said first lead is perpendicular to a long side of a rectangular stacked component.

65. The electronic device of claim 61 wherein a long dimension of said first lead is parallel to a long side of a rectangular stacked component.

66. The electronic device of claim 53 wherein said first lead attachment has a cross-sectional projection ratio of at least 1:1.

67. The electronic device of claim 53 wherein said first lead attachment comprises an integrally formed stand-off.

68. The electronic device of claim 67 wherein said stability pin is attached to said stand-off.

69. The electronic device of claim 53 wherein said second lead comprises a second stability pin.

70. The electronic device of claim 69 wherein said second stability pin is diagonally across said stacked component from said stability pin.

71. The electronic device of claim 53 wherein said stability pin extends from said foot.

72. The electronic device of claim 53 wherein said stability pin extends from said first lead.

73. The electronic device of claim 53 wherein said foot is a bifurcated foot.

74. The electronic device of claim 53 wherein said foot is wider than said lead at a junction of said foot and said lead.

75. The electronic device of claim 53 wherein said foot is narrower than said lead at a junction of said foot and said lead.

76. An electronic device comprising:

a circuit board comprising at least one solder pad and at least one hole;

a passive electronic stacked component electrically connected to said circuit board wherein said passive electronic stacked component comprises:

a stack of capacitors;

a first lead secured to a first side of said stack;

a second lead secured to a second side of said stack;

a first foot attached to said first lead with a stand-off distance between said foot and said stack and extending inward towards second lead wherein said first foot is electrically attached to said solder pad; and a stability pin attached to one of said first foot or said first lead wherein said stability pin is in said hole wherein said stability pin is not parallel to said first lead.

77. The electronic device of claim 76 wherein said stability pin impinges a wall of said hole.

* * * * *